United States Patent [19]

Kawai

[11] Patent Number: 4,894,830

[45] Date of Patent: Jan. 16, 1990

[54] LSI CHIP WITH SCANNING CIRCUITRY FOR GENERATING REVERSALS ALONG ACTIVATED LOGICAL PATHS

[75] Inventor: Masato Kawai, Tokyo, Japan

[73] Assignee: NEC Corporation, Tokyo, Japan

[21] Appl. No.: 145,069

[22] Filed: Jan. 19, 1988

[30] Foreign Application Priority Data

Jan. 17, 1987 [JP] Japan .................................. 62-7442

[51] Int. Cl.4 .......................................... G01R 31/28
[52] U.S. Cl. .................................................. 371/22.3
[58] Field of Search ................. 371/25, 15; 324/73 R, 324/73 AT

[56] References Cited

U.S. PATENT DOCUMENTS

| | | | |
|---|---|---|---|
| 4,063,080 | 12/1977 | Eichelberger | 371/25 X |
| 4,553,090 | 11/1985 | Hatano | 371/15 X |
| 4,554,664 | 11/1985 | Schultz | 371/25 |
| 4,580,137 | 4/1986 | Fielder | 371/25 X |
| 4,588,944 | 5/1986 | Rothenberger | 371/25 X |
| 4,602,349 | 7/1986 | Blackley | 371/25 X |
| 4,613,970 | 9/1986 | Masuda | 371/25 |
| 4,680,761 | 7/1987 | Burkness | 371/25 |
| 4,697,267 | 9/1987 | Wakai | 371/25 |
| 4,701,920 | 10/1987 | Resnick | 371/25 |
| 4,718,065 | 1/1988 | Boyle | 371/25 |
| 4,733,405 | 3/1988 | Shimizume | 371/25 X |
| 4,780,874 | 10/1988 | Lenoski | 371/25 |

Primary Examiner—John R. Lastova
Assistant Examiner—Robert W. Beausoliel
Attorney, Agent, or Firm—Sughrue, Mion, Zinn, Macpeak & Seas

[57] ABSTRACT

A plurality of first flip-flop circuits are provided having outputs connected respectively to inputs of a logic circuit. During a test mode, scan data is first loaded into the flip-flop circuits to activate desired logical paths in the logic circuit and subsequently a pulse is scanned across the first flip-flop circuits to cause successive reversals to occur in the stored scan data. As a result, test signals can propagate through the activated logical paths. Connected to the outputs of the logic circuit are a plurality of second flip-flop circuits which are configured into a linear feedback shift register during the test mode to enable a test circuit to observe its serial output to determine the dynamic performance of the logic circuit.

4 Claims, 6 Drawing Sheets

FIG.5

| MODE CTRL SIGNAL (MD1) | SCAN CTRL SIGNAL (SC1) | REV CTRL SIGNALS (RL) | OPERATING MODES OF SCAN-IN FLIP-FLOPS |
|---|---|---|---|
| 0 | 0 | — | NORMAL DATA ENTRY |
| 0 | 1 | — | SCAN DATA ENTRY |
| 1 | 1 | 0 | DATA HOLD |
| 1 | 1 | 1 | DATA REVERSAL |

LSI CHIP WITH SCANNING CIRCUITRY FOR GENERATING REVERSALS ALONG ACTIVATED LOGICAL PATHS

BACKGROUND OF THE INVENTION

The present invention relates generally to large-scale integration and more specifically to an LSI chip having a test circuit that enables the determination of the dynamic performance of the chip through activated logical paths at chip's operating speed.

According to one prior art LSI chip which is shown in FIG. 1, a combinational logic circuit 1 has a plurality of inputs which are divided into two groups 2a and 2b and a plurality of outputs similarly divided into groups 3a and 3b. Data are supplied through inputs 2a and delivered through outputs 3a. Outputs 3b are respectively coupled to switching gates 4 whose outputs are in turn coupled respectively to data inputs of successively arranged flip-flops 5-1 through 5-n. The outputs of the flip-flops are respectively coupled to inputs 2b on the one hand and to an input of the next switching gate 4 except for flip-flop 5-n whose output is coupled to a scan-out terminal SO. During a normal mode, a logic 0 is applied to a scan-control terminal SC to permit data from outputs 3b to be passed to the associated flip-flops so that the flip-flops 5-1 through 5-n form part of a sequential logic circuit with the combinational logic circuit 1. During a test mode, scan (test) data is applied to a scan-in terminal SI and a logic 1 is applied to scan-control terminal SC to cause the scan data to be sequentially shifted from one flip-flop to the next in a similar fashion to a shift register and a series of scan data are loaded into the flip-flops for coupling to inputs 2b of the logic circuit. Subsequently, a logic 0 is applied to the scan control terminal SC to deliver output data through outputs 3b to the associated flip-flops through switching gates 4 and the flip-flops are clocked to store the output data. Finally, a logic 1 is applied to the scan control terminal SC to sequentially read the stored test data from the scan-out terminal SO. Although satisfactory for generating test data for measurement of the static performance of a desired logical path, this "scan path" approach is incapable of generating such test data which allows measurement of propagation delays or dynamic performance of the logic circuit along activated paths.

Another prior art, which is shown in FIG. 2, is a combination of combinational logic circuits 6, 7 in which the scan path is in the form of linear feedback shift registers 8, 9 respectively interposed between the logic circuits 6 and 7 to generate pseudo-random test data and store them in a compressed form. While this approach is capable of testing at the operating speed of the logic circuits, it is incapable of generating such test data which allows activation of desired logical paths within the logic circuits and measurement of propagation delays along the activated logical paths.

SUMMARY OF THE INVENTION

It is therefore an object of the present invention to provide an integrated circuit chip having circuitry that enables activation of any desired logical paths of the chip and propagation of test pulses along the activated paths to permit determination of the dynamic performance of the logic circuit at the operating speed thereof.

According to the invention, a plurality of first flip-flops are provided having outputs connected respectively to inputs of a logic circuit. During a test mode, scan data is first loaded into the flip-flops to activate desired logical paths in the logic circuit and subsequently a pulse is generated by a scanning circuit and scanned across the first flip-flop to cause successive reversals to occur in the stored scan data. As a result, test signals can propagate through the activated paths. Connected to the outputs of the logic circuit are a plurality of second flip-flops which are configured in a linear feedback shift register during the test mode to combine the parallel outputs of the logic circuit with the scan data output from the first flip-flops to derive a serial output. A test circuit observes the serial output of the shift register to determine the dynamic performance of the logic circuit at the speed of its operation.

Specifically, the scanning circuit comprises a first counter for counting clock pulses and generating a counter output at one half the frequency of the clock pulses. A second counter is responsive to the counter output to generate an incremental binary code, the binary code being supplied to a decoder for generating a pulse having a duration twice as greater than the interval between successive clock pulses. The pulse is applied to one of the flip-flops and shifted to the next in response to successive increments of the binary code. A gate circuit is associated with each of the flip-flops to cause the output of the associated flip-flop to be reversed in logic level in response to the clock pulses that occur during the presence of said pulse.

BRIEF DESCRIPTION OF THE DRAWINGS

The present invention will be described in further detail with reference to the accompanying drawings, in which:

FIG. 5 is a truth table for the operating modes of the scan-in flip-flop circuits;

DETAILED DESCRIPTION

Figure 1:
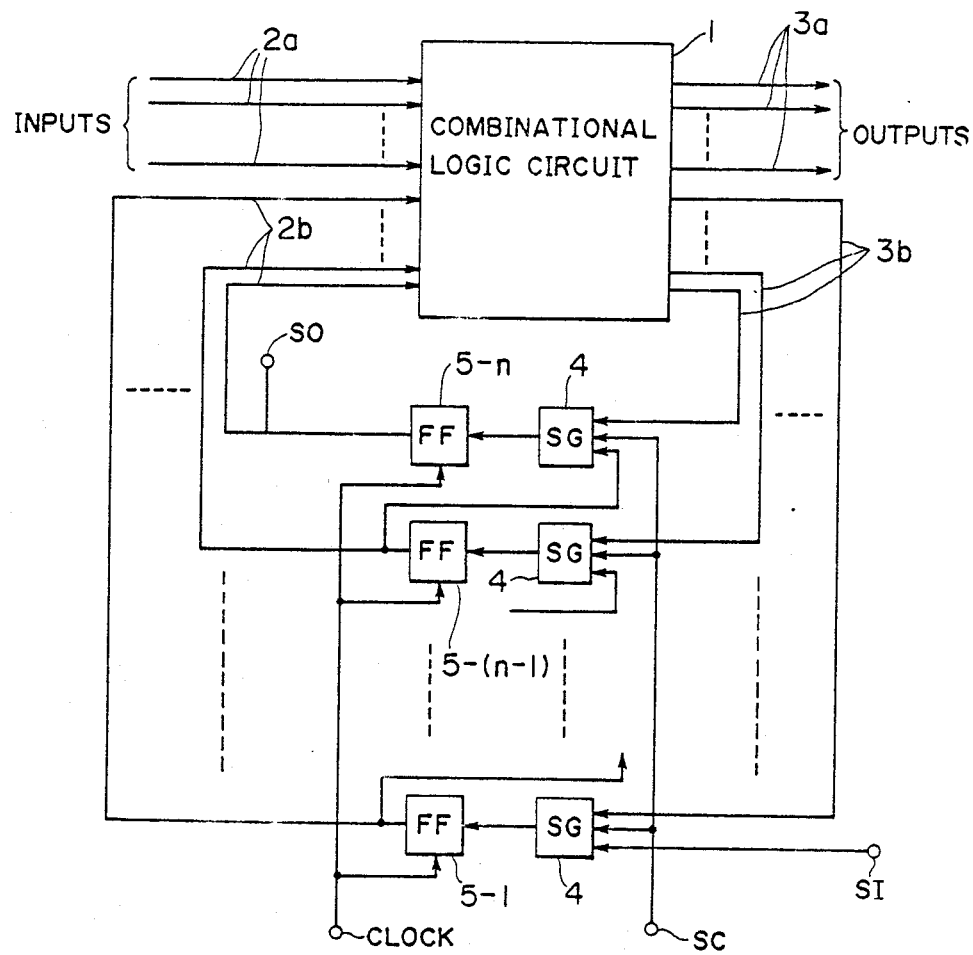
FIG. 1 is a block diagram of a prior art large-scale integrated circuit with flip-flops arranged to form a scan-in and scan-out shift register during test modes.
Figure 2:
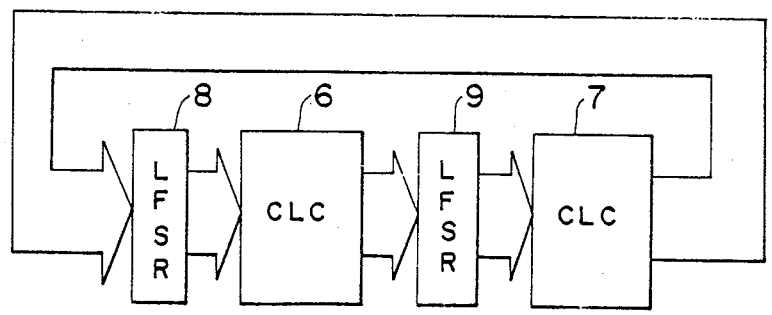
FIG. 2 is a block diagram of a prior art large-scale integrated circuits with linear feedback shift registers.
Figure 3:
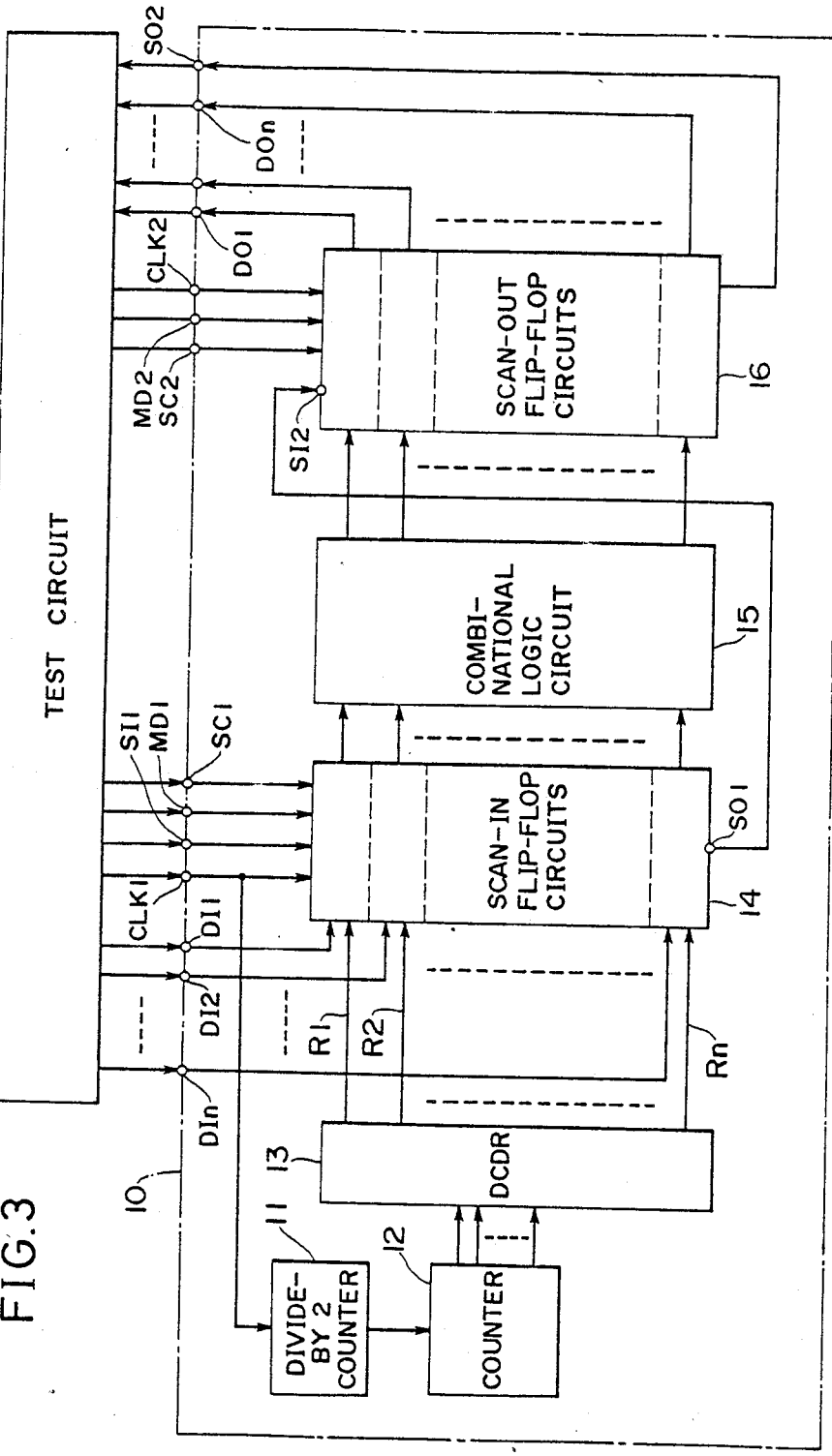
FIG. 3 is a block diagram of a large scale integrated circuit chip according to the present invention.

As represented in FIG. 3, a large scale integrated circuit chip 10 of this invention comprises a divide-by-2 counter 11 which counts block pulses CLK1 from the timing circuit of a test circuit 17, and a binary counter 12 for generating a sequential binary code in response to the output of divide-by-2 counter 11. Parallel bits of the sequential binary code are applied to a decoder 13 having a plurality of output lines R1 through Rn which are connected to a plurality of scan-in flip-flop circuits 14. Decoder 13 generates an output pulse having a duration of two clock intervals. The output pulse of decoder 13 appears at one of its output lines and is successively shifted to the next in response to the increment of the binary count. As will be described, the output of decoder 13 is a reverse control signal which causes successive reversals to occur in the logic state of scan-in (test) data supplied to the scan-in the flip-flop circuits 14 through a scan input port SI1 from the test circuit 17.

Scan-in flip-flop circuits 14 further receive a mode select signal from test circuit in through a mode select port MD1 and a scan control signal through a scan control port SC1. Normal data are loaded into the scan-in flip-flop circuits 14 through data input ports DI1 to DIn during a normal mode. Scan-in flip-flop circuits 14 have a plurality of outputs coupled to corresponding inputs of a combination logic circuit 15 of conventional design in which logical paths are established from the inputs thereof to output terminals which are in turn connected to corresponding inputs of scan-out flip-flop circuits 16. During a test mode of operation, scan data is loaded into the flip-flop circuits 14 through the scan input port SC1 to activate desired logical paths in the logic circuit 15. Successive reversals occur in the scanning data loaded into scan-in flip-flop circuits 14 in synchronism with clock pulses CLK1 to cause test pulse to propagate through the activated logical path and appear at one of the outputs of logic circuit 15. Scan-out flip-flop circuits 16 have their respective outputs coupled to data output ports DO1 to DOn which are in turn connected to the test circuit 17 during the test mode. Although all output and input ports of the LSI chip are shown connected to the test circuit 17, a certain of the output ports DO1 through DOn of scan-out flip-flop circuits 16 may be coupled to a certain of the input port DI1 through DIn of scan-in flip-flop circuits 14.

Scan-out flip-flop circuits 16 are synchronized with a second clock pulse CLK2 having the same clock frequency as the clock pulse CLK1, but delayed with respect to the first clock pulse by an amount equal to the propagation delay of the logic circuit 15.

Scan-out flip-flop circuits 16 are arranged to form a linear feedback shift register in response to a mode control signal supplied from a mode select port MD2 and a scan control signal supplied from a scan control port SC2. The output of the final stage of the linear feedback shift register is applied to the test circuit 17 through a scan output port SO2 to permit it to analyze the test data and determine the dynamic performance of logic circuit 15.

Figure 4:
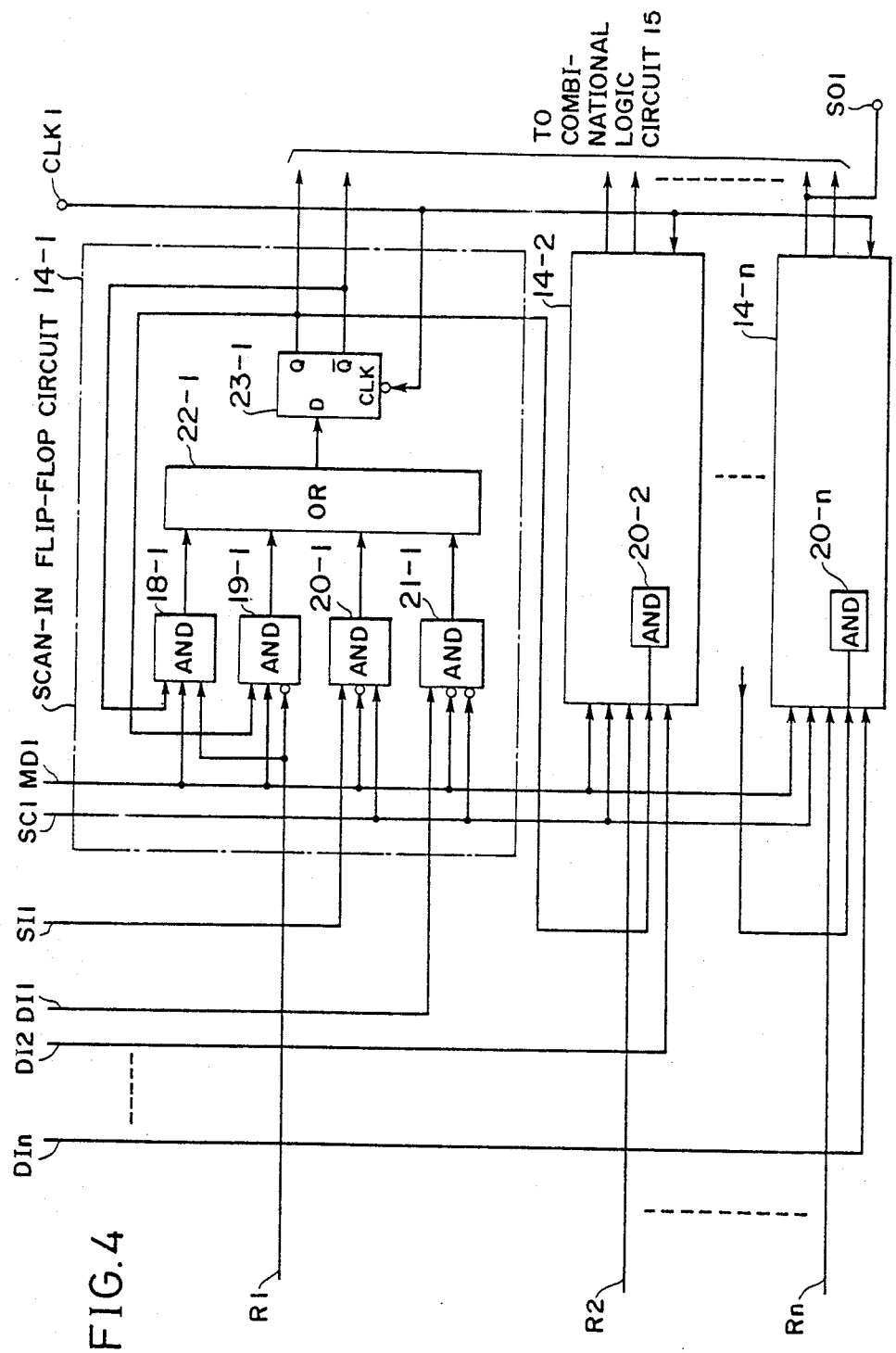
FIG. 4 is a block diagram of the scan-in flip-flop circuits of FIG. 1.

Referring to FIG. 4, scan-in flip-flop circuits 14 are designated by numerals 14-1 through 14-n. Each scan-in flip-flop circuit 14-i (where i=1, 2 . . . n) comprises AND gates 18-i, 19-i, 20-i and 21-i the outputs of which are coupled through an OR gate 22-i to the data input of a D flip-flop 23-i. To cause successive reversals to occur in scan-in data from part SCI in response to a pulse from decoder 13, the true and complementary outputs of flip-flop 23-i are coupled to inputs of AND gates 19-i and 18-i, respectively. The true output of each flip-flop 23-i is further coupled to an input of AND gate 20-(i+1). Flip-flop 23-i has an inverted clock input to which clock pulses from terminal CLK1 are supplied. The mode select port MD1 is coupled to inputs of AND gates 18-i and 19-i and to inverted inputs of AND gates 20-i and 21-i, and scan control port SC1 is coupled to a noninverted input of AND gate 20-1 and an inverted input of AND gate 21-i.

As shown in FIG. 5, mode select port MD1 is at logic 0 when normal data or scan data are entered to the scan-in flip-flop circuits 14-1 through 14-n, and switches to logic 1 during a test mode. With the mode select port MD1 being at logic 0, scan control port SC1 is at logic 0 for entry of normal data and at logic 1 for entry of scan data. With the mode select port MD1 being at logic 1, each of the reverse control outputs R1 through Rn is at logic 0 for holding the logic state of the test data and at logic 1 for effecting successive reversals of the logic state.

Therefore, AND gates 20-i and 21-i are respectively enabled during a scan data entry mode and during a normal data entry mode. Scan data is applied through the scan input port SI1 to AND gate 20-1. When this AND gate is enable during a scan data entry mode, the scan data is fed to the data input of flip-flop 23-1. In response to a clock pulse supplied to an inverted clock input, the true output of this flip-flop changes to the logical value of the scan data, causing the data input of flip-flop 23-2 to change accordingly. The true output of this flip-flop 23-2 changes likewise in response to the next clock pulse. The process is repeated until all bits of the scan data are respectively loaded into all flip-flops 23-1 through 23-n. The loaded scan data bits are supplied to the logic circuit 15 so that desired logical paths can be activated.

The output port Ri of decoder 13 is connected to an nonverted input of AND gate 18-i and an inverted input of AND gate 19-i. When the mode select port MD1 is at logic 1, AND gate 18-i is enabled in response to a logic 1 that appears at the reverse control port Ri and AND gate 19-i is enabled in response to a logic 0 that appears at the reverse control port Ri. The true output of flip-flop 23-n of the circuit 14-n is coupled through a scan output terminal SO1 to the scan input terminal SI2 of the scan-out flip-flop circuits 16.

Figure 6:
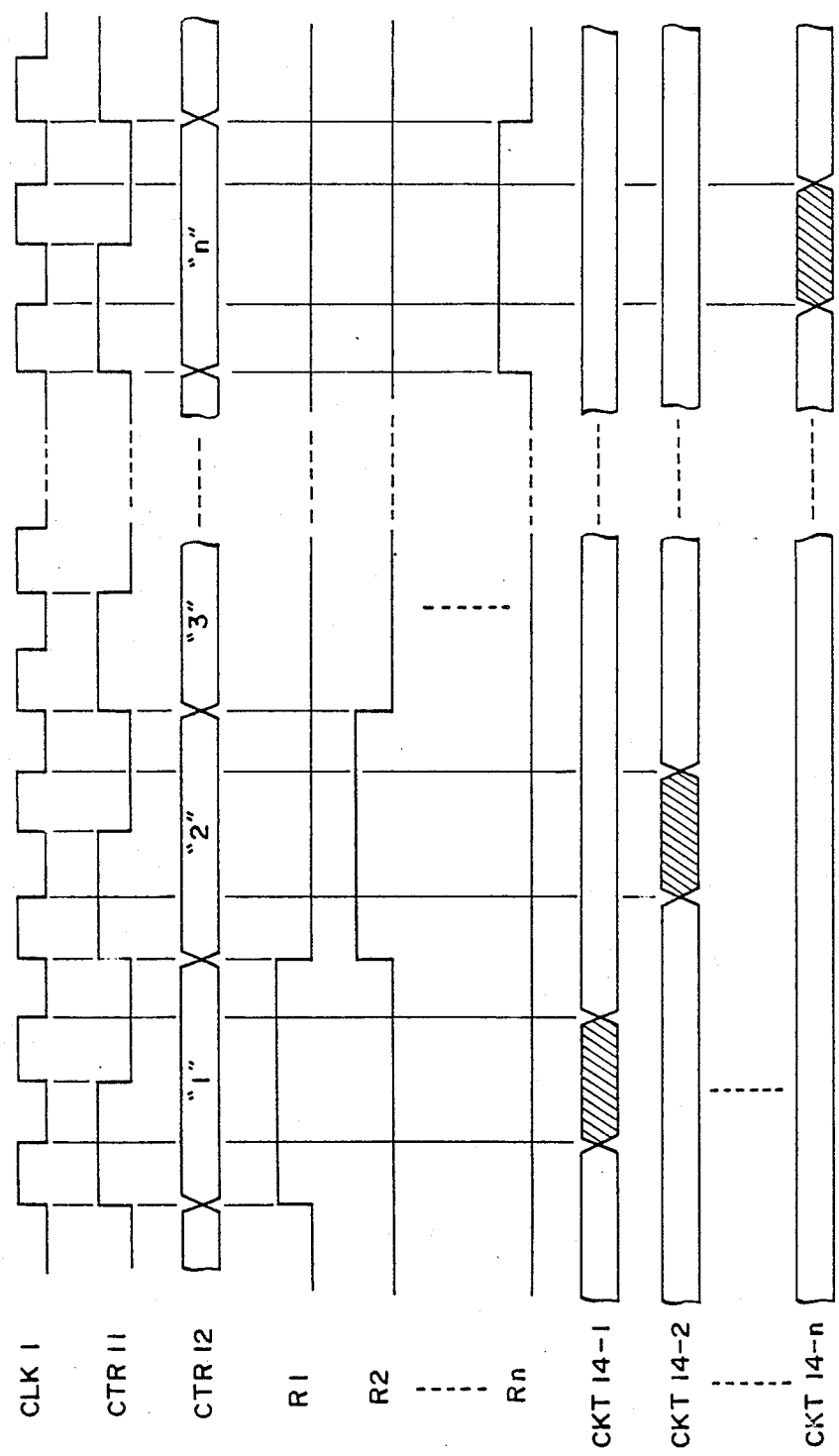
FIG. 6 is a sequence diagram useful for describing the operation of the scan-in flip-flops.

The operation of the scan-in flip-flop circuits 14 can best be understood with reference to a sequence diagram shown in FIG. 6. Assume that the true and complementary outputs of flip-flop 23-i are logic 1 and 0, respectively, and the port Ri is at logic 0. Under these conditions, AND gate 18-i is disabled and AND gate 19-i is enabled to pass the logic 1 at the true spirit of flip-flop 23-i to its data input through OR gate 22-i. When the port Ri switches to logic 1, AND gate 18-i is enabled, passing the logic 0 at the complementary output of flip-flop 23-i to its data input through OR gate 22-i and AND gate 19-i disabled. Thus, in response to the negative transition of a clock pulse, the logic states of the true and complementary outputs of flip-flop 23-i reversed and in response to the negative transition of the next clock pulse their logic states return to the original states. A logic reversal thus occurs in one of the flip-flop circuits 14 and 15 successively shifted to the next causing a clock-synchronous pulse to propagate through an activated logical path of the logic circuit 15. The dynamic performance of the activated logical path can be determined by the test circuit 17 by operating the circuits 14, 15, 16 at a real-time speed so that the parallel outputs of the logic circuit 15 can be stored in the linear shift register configuration of the flip-flop circuits 16. As a result, the signals stored in the linear feedback shift register can be serially supplied to the test circuit 17 at a speed which can be lower than the speed at which circuits 14, 15 and 16 are operated.

Figure 7:
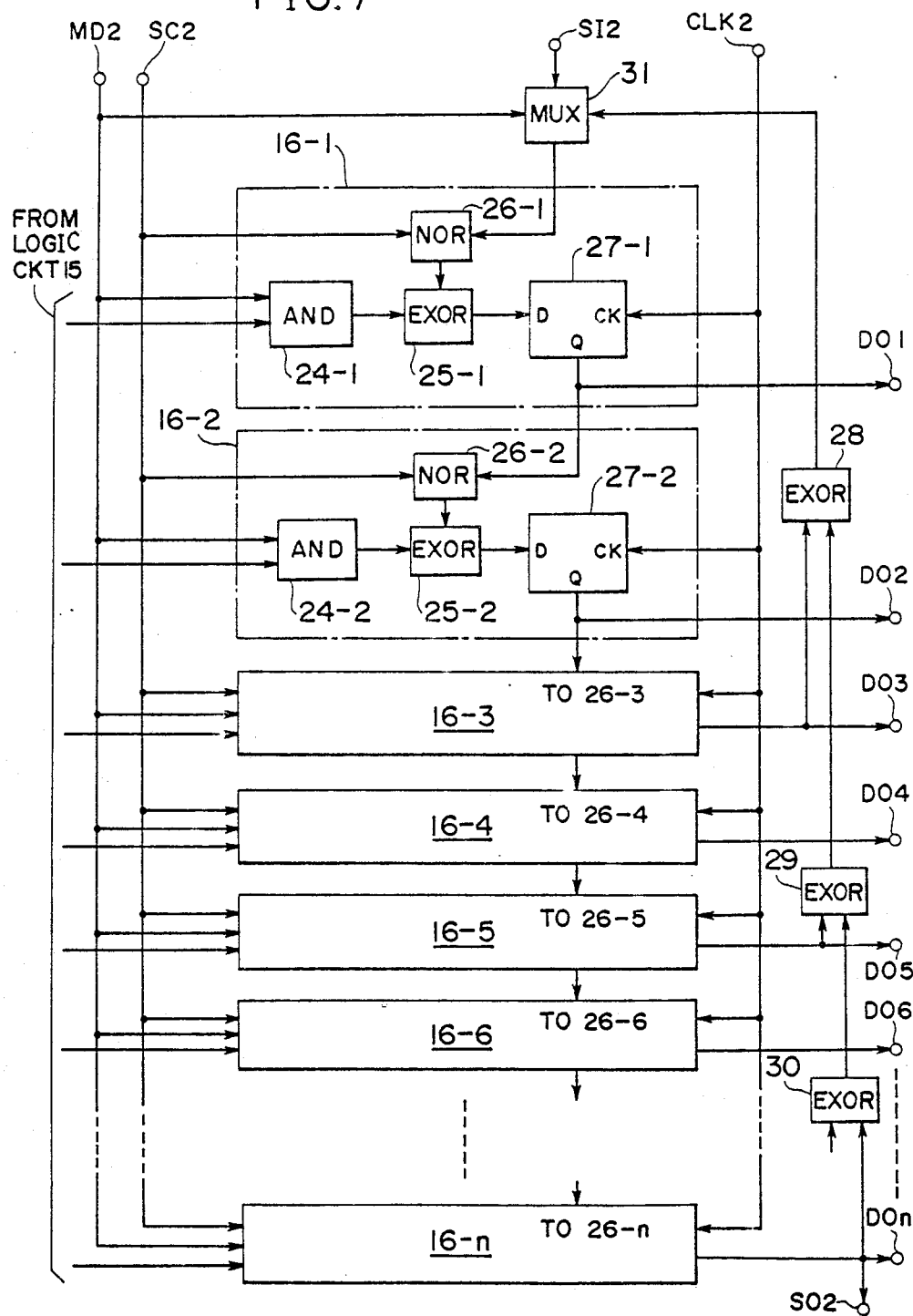
FIG. 7 is a block diagram of the scan-out flip-flop circuits of FIG. 1.

Scan-out flip-flop circuits 16, designated by numerals 16-1 through 16-n in FIG. 7, are arranged to form a linear feedback shift register to supply data to the test circuit 17 to allow it to determine the dynamic performance of the logic circuit 15. Each scan-out flip-flop circuit 16-i includes an AND gate 24-i, an exclusive-OR gate 25-i, a NOR gate 26-i and a D flip-flop 27-i which is driven by clock pulses supplied through clock terminal CLK2. The output of each flip-flop 27-i is connected to the corresponding data output port DOi and the output of flip-flop 27-n is further connected to the scan output port SO2.

AND gate 24-i has a first input coupled to an associated output port of the logic circuit 15 and a second input coupled to the mode control port MD2. NOR gate 26-1 has a first input coupled to the scan control terminal SC2 and a second input coupled to the output of a multiplexer 31, the output of NOR gate 26-1 being connected to exclusive-OR gate 25-1 to which the output of AND gate 24-1 is also applied. The output of exclusive-OR gate 25-i is applied to the data input of flip-flop 27-i, the Q output of flip-flops 27-1 through 27-(n−1) being coupled to the second input of NOR gates 26-2 through 26-n, respectively. Exclusive-OR gates 28, 29 and 30 are connected to a certain of the outputs of flip-flops 27 to form feedback paths to the multiplexer 31 to which the scan data output of scan-in flip-flop circuits 14 is applied through the scan input terminal SI2. Multiplexer 31 multiplexes its input pulses and feeds the second input of NOR gate 26-1 in response to a switching control signal supplied from the mode select port MD2.

During a shift mode, the mode select terminal MD2 and scan control terminal SC2 are both at logic 0. Parallel outputs from logic circuit 15 are denied entry to the flip-flop circuits 16-1 through 16-n, but the scan output of scan-in flip-flop circuits 14 is allowed entry through multiplexer 31 and NOR gate 26-1 to exclusive-OR gate 25-1 to produce an output at the data input of flip-flop 27-1. In response to a series of clock pulses supplied through terminal CLK2, the output of flip-flop 27-1 is shifted along the successive flip-flops until it is stored into flip-flop 27-n to initialize the linear feedback shift register.

During a "signature" entry mode, a logic 1 is applied to the mode select terminal MD2 with the scan control terminal SC2 being still at logic 0. Parallel outputs, or "signature" of the logic circuit 15 are allowed entry through AND gates 24-i to the associated flip-flops 27-i and combined with the stored data. The combined data are fed back through exclusive-OR gates 28, 29 and 30 and multiplexer 31 to exclusive-OR gate 25-1 to rewrite all the flip-flops 27 with logic states which are derived by the associated exclusive-OR gates 25-i from the outputs of flip-flops of preceding stages and the parallel outputs of the logic circuit 15.

During a data output mode, the mode select port MD2 is again switched to logic 0 with the scan control port SC2 still being at logic 0. The shift register 16 is again operated in a shift mode to shift the contents of the flip-flops 27 through output port SO2 to the test circuit 17 to allow it to determine the dynamic performance of the logic circuit 15.

The scan-out flip-flop circuits 16 are reset when the scan control port SC2 is switched to logic 1 with the mode select port MD2 being at logic 0. During normal modes, the test circuit 17 is disconnected from the LSI chip 10 and the data input and output ports are connected to other LSI chips and both of the mode select port MD2 and scan control port SC2 are at logic 1 to allow the parallel outputs of logic circuit 15 to enter the flip-flop circuits 16.

The foregoing description shows only one preferred embodiment of the present invention. Various modifications are apparent to those skilled in the art without departing from the scope of the present invention which is only limited by the appended claims. Therefore, the embodiment shown and described is only illustrative, not restrictive.

What is claimed is:

1. An integrated circuit chip comprising:
   scanning means for generating a scanning pulse at one of a plurality of terminals and successively shifting said scanning pulse from said one terminal to the next at clock intervals;
   a plurality of first flip-flops respectively associated with said terminals;
   a logic circuit having a plurality of inputs coupled respectively to outputs of said first flip-flops and a plurality of logical paths between said inputs thereof and a plurality of outputs thereof, said logical paths being activated when said first flip-flops assume a predetermined logic state;
   a plurality of first data loading means respectively coupled between a respective one of said terminals and a respective one of said scan-in flip-flops, said data loading means being operable during a test mode for loading scan data into said first flip-flops to cause same to assume said predetermined logic state to thereby activate said logical paths and causing each of said flip-flops to momentarily change state in response to said scanning pulse, whereby successive reversals occur in the loaded scan data, resulting in propagation of a signal through each of said activated logical paths, said data loading means being further operable during a normal mode for loading normal data into said first flip-flops;
   a plurality of second flip-flops; and
   a plurality of second loading means respectively coupled between a respective one of said outputs of said logic circuit and a respective one of said second flip-flops for loading output data of said logic circuit into said second flip-flops and causing said second flip-flops to generate a serial output during said test mode and parallel outputs during said normal mode.

2. An integrated circuit chip as claimed in claim 1, wherein said scanning means comprises:
   first counter means for counting clock pulses and generating a counter output at one half the frequency of said clock pulses;
   second counter means for generating an incremental binary code in response to said counter output of said first counter means; and
   decoder means responsive to said binary code for generating said scanning pulse at one of said terminals and successively shifting said scanning pulse from said one terminal to the next in response to successive increments of said binary code, said scanning pulse having a duration twice as great as the interval between successive ones of said clock pulses, and
   wherein said plurality data loading means comprises:
   a plurality of gate means operable during said test mode and respectively connected between outputs and inputs of said flip-flops for causing logic levels of the output of the associated flip-flop to be successively reversed in response to said clock pulses during the presence of said scanning pulse.

3. An integrated circuit chip as claimed in claim 2, wherein said plurality of second data loading means comprise:

means for forming a linear feedback shift register with said second flip-flops during said test mode; and means operable during said test mode for loading said scan data into said second flip-flops and subsequently loading said output data of said logic circuit into said second flip-flops to generate said serial output from an output end of the shift register to permit the serial output to be observed by a test circuit and operable during said normal mode for exclusively loading the output data of said logic circuit into said second flip-flops to generate said parallel outputs therefrom, said second flip-flops being responsive to second clock pulses having a frequency equal to the frequency of said first-mentioned clock pulses and phase delayed with respect to the phase of the first clock pulses by an amount equal to a propagation delay in said logic circuit to generate said serial output.

4. An integrated circuit chip as claimed in claim 1, wherein said plurality of second data loading means comprise:

means for forming a linear feedback shift register with said second flip-flops during said test mode; and means operable during said test mode for loading said scan data into said second flip-flops and subsequently loading said output data of said logic circuit into said second flip-flops to produce said serial output from an output end of said shift register to permit the serial output to be observed by a test circuit and operable during said normal mode for exclusively loading the output data of said logic circuit into said second flip-flops to generate said parallel outputs therefrom, said second flip-flops being responsive to second clock pulses having a frequency equal to the frequency of said first-mentioned clock pulses and phase delayed with respect to the phase of the first clock pulses by an amount equal to a propagation delay in said logic circuit to generate said serial output.

* * * * *